United States Patent
Im et al.

(10) Patent No.: US 8,907,330 B2
(45) Date of Patent: Dec. 9, 2014

(54) ORGANIC LIGHT EMITTING DIODE DISPLAY AND MANUFACTURING METHOD THEREOF

(71) Applicant: Samsung Display Co., Ltd., Yongin (KR)

(72) Inventors: Ja-Hyun Im, Yongin-si (KR); Tae-Kwang Sung, Yongin-si (KR); Ji-Hwan Yoon, Yongin-si (KR); Kwan-Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/918,814

(22) Filed: Jun. 14, 2013

(65) Prior Publication Data

US 2014/0070185 A1 Mar. 13, 2014

(30) Foreign Application Priority Data

Sep. 7, 2012 (KR) .................. 10-2012-0099101

(51) Int. Cl.
| | |
|---|---|
| *H01L 29/08* | (2006.01) |
| *H01L 27/32* | (2006.01) |
| *H01L 51/56* | (2006.01) |
| *H01L 51/50* | (2006.01) |
| *H01L 51/52* | (2006.01) |

(52) U.S. Cl.
CPC ........ *H01L 51/5064* (2013.01); *H01L 27/3211* (2013.01); *H01L 51/506* (2013.01); *H01L 51/5281* (2013.01); *H01L 51/5265* (2013.01); *H01L 51/56* (2013.01)
USPC .............. 257/40; 257/78; 257/82; 257/88

(58) Field of Classification Search
CPC ............................ H01L 27/32; H01L 51/50
See application file for complete search history.

(56) References Cited

U.S. PATENT DOCUMENTS

| | | | | |
|---|---|---|---|---|
| 7,956,531 | B2 * | 6/2011 | Smith | 313/505 |
| 7,965,033 | B2 * | 6/2011 | Hwang et al. | 313/504 |
| 2005/0173700 | A1 * | 8/2005 | Liao et al. | 257/40 |

FOREIGN PATENT DOCUMENTS

| | | | |
|---|---|---|---|
| KR | 1020030044658 | A | 6/2003 |
| KR | 100622230 | B1 | 9/2006 |
| KR | 100659131 | B1 | 12/2006 |

* cited by examiner

*Primary Examiner* — Kyoung Lee
(74) *Attorney, Agent, or Firm* — Christie, Parker & Hale, LLP

(57) ABSTRACT

An organic light emitting diode display including a substrate, a first electrode on the substrate, a light-emitting layer on the first electrode, a second electrode on the light-emitting layer, and a p-doping layer between the first electrode and the light-emitting layer.

14 Claims, 2 Drawing Sheets

ORGANIC LIGHT EMITTING DIODE DISPLAY AND MANUFACTURING METHOD THEREOF

CROSS-REFERENCE TO RELATED APPLICATION

This application claims priority to and the benefit of Korean Patent Application No. 10-2012-0099101, filed on Sep. 7, 2012, with the Korean Intellectual Property Office, the disclosure of which is incorporated herein in its entirety by reference.

TECHNICAL FIELD

Embodiments of the present invention relate to an organic light emitting diode display and a manufacturing method thereof.

BACKGROUND

An organic light emitting diode display is a self-emission display device that has an organic light emitting diode that emits light to display an image. Since the organic light emitting diode display does not require a separate light source, unlike a liquid crystal display, it is possible to reduce thickness and weight thereof. Further, since the organic light emitting diode display has high-grade characteristics, such as low power consumption, high luminance, and a high response speed, the organic light emitting diode display receives attention as the next-generation display device for portable electronic apparatuses.

In the organic light emitting diode display, various efforts for reducing power consumption and increasing efficiency have been attempted. For example, there are examples to achieve low voltage, high efficiency, and long lifespan by using a material having high charge mobility in a hole injection layer, a hole transport layer, and the like.

FIG. 1 schematically illustrates a structure of a general organic light emitting diode. Referring to FIG. 1, in the general organic light emitting diode display, a first pixel electrode, a second pixel electrode, and a third pixel electrode as a first electrode 20 are formed on a substrate 10, and the first electrode 20 is partitioned by a pixel defining layer (PDL) 30 for each pixel unit. A light-emitting layer 50 is formed on the first electrode 20, and is classified into a red light-emitting layer, a green light-emitting layer, and a blue light-emitting layer, respectively. A common electrode as a second electrode 60 is formed on the light-emitting layer 50. At least one of a hole injection layer 42 and a hole transport layer 44 may be disposed between the first electrode 20 and the light-emitting layer 50. Further, at least one of an electron transfer layer 46 and an electron injection layer 48 may be disposed between the light-emitting layer 50 and the second electrode 60.

The light-emitting layer 50 is formed by selecting and applying a material capable of yielding maximum, or suitable, efficiency for each of the red light-emitting layer, the green light-emitting layer, and the blue light-emitting layer. Further, resistance for each of red, green, and blue light-emitting layers, and therefore, each driving voltage as well, varies according to the selected emission material. Accordingly, current is further concentrated in a pixel having low resistance (that is, low driving voltage) among red, green, and blue according to a physical property of current having a tendency to flow to a place having low resistance. However, in the process, when a color having the lowest resistance among red, green, and blue has highest emission efficiency, luminance in the entire panel is increased at black current, and a contrast ratio is deteriorated.

SUMMARY

Embodiments of the present invention provide an organic light emitting diode display capable of preventing or avoiding problems (such as increase in black luminance, and deterioration of a contrast ratio) by forming a p-doping layer to control relative driving voltage and relative efficiency of red, green, and blue.

Further, embodiments of the present invention provide a method of manufacturing an organic light emitting diode display.

An exemplary embodiment of the present invention provides an organic light emitting diode display including a substrate, a first electrode on the substrate, a light-emitting layer on the first electrode, a second electrode on the light-emitting layer, and a p-doping layer between the first electrode and the light-emitting layer.

The light-emitting layer may include a red light-emitting layer, a green light-emitting layer, and a blue light-emitting layer, and the p-doping layer may be in at least one of a red pixel corresponding to the red light-emitting layer or a blue pixel corresponding to the blue light-emitting layer.

The light-emitting layer may include a red light-emitting layer, a green light-emitting layer, and a blue light-emitting layer, and the p-doping layer may be in a red pixel corresponding to the red light-emitting layer.

The organic light emitting diode display may further include at least one of a hole injection layer (HIL) and a hole transport layer (HTL) between the first electrode and the light-emitting layer.

The hole injection layer (HIL) and the hole transport layer (HTL) may be between the first electrode and the light-emitting layer, and the p-doping layer may be between the hole injection layer (HIL) and the hole transport layer (HTL).

The p-doping layer may include at least one of hexanitril hexaazatriphenylene, trifluoro-tetracyanoquinodimethane (F4-TCNQ), lithium quinolate (LiQ) FeCl3, F16CuPc, a compound represented by the following Chemical Formula 1, or metal oxide.

[Chemical Formula 1]

The metal oxide may include vanadium oxide (V2O5), rhenium oxide (Re2O7), or indium tin oxide.

A thickness of the p-doping layer may be about 10 Å to about 200 Å.

The p-doping layer may include a resonance auxiliary layer.

The resonance auxiliary layer may be in a matrix, and a p-doping material may be in the matrix.

The p-doping material may be about wt % 0.1 to about 30 wt % of the matrix.

Another exemplary embodiment of the present invention provides an organic light emitting diode display including a substrate, a first electrode on the substrate, a light-emitting layer on the first electrode and including a red light-emitting layer, a green light-emitting layer, and a blue light-emitting layer, and a second electrode on the light-emitting layer, wherein driving voltages of a red pixel corresponding to the red light-emitting layer and a blue pixel corresponding to the blue light-emitting layer are lower than a driving voltage of a green pixel corresponding to the green light-emitting layer.

Another exemplary embodiment of the present invention provides a manufacturing method of an organic light emitting diode display, the method including forming a first electrode on a substrate, forming a light-emitting layer on the first electrode, forming a second electrode on the light-emitting layer, and forming a p-doping layer between the first electrode and the light-emitting layer.

The forming of the light-emitting layer may include forming a red light-emitting layer, forming a green light-emitting layer, and forming a blue light-emitting layer, and the p-doping layer may be in at least one of a red pixel corresponding to the red light-emitting layer and a blue pixel corresponding to the blue light-emitting layer.

The forming of the light-emitting layer may include forming a red light-emitting layer, forming a green light-emitting layer, and forming a blue light-emitting layer, and the p-doping layer may be in a red pixel corresponding to the red light-emitting layer.

According to the exemplary embodiments of the present invention, it is possible to manufacture an organic light emitting diode display having reduced black luminance and an improved contrast ratio by introducing a p-doping layer having a high hole injection property for each RGB pixel to control relative driving voltage and relative emission efficiency.

The foregoing summary is illustrative only, and is not intended to be limiting in any way. In addition to the illustrative aspects and embodiments described above, further aspects and embodiments will become apparent by reference to the drawings and the following detailed description.

DETAILED DESCRIPTION

Figure 1:
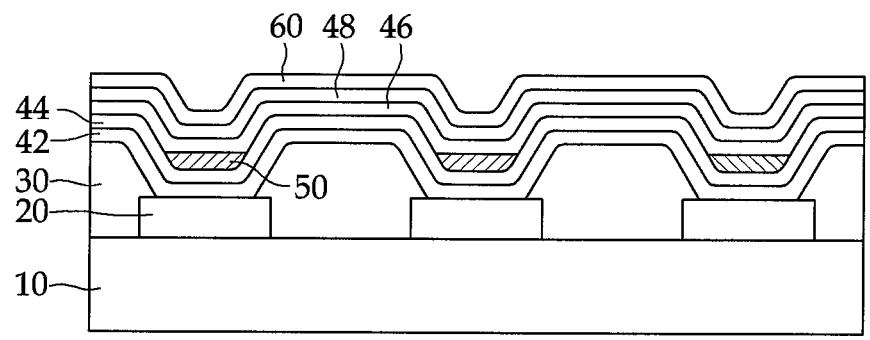
FIG. 1 is a diagram illustrating a structure of a general organic light emitting diode.

Hereinafter, exemplary embodiments of the present invention will be described in detail with reference to the accompanying drawings.

Although the present invention can be modified variously and can have several embodiments, specific exemplary embodiments are illustrated in the accompanying drawings and will be mainly described in the specification. However, the scope of the present invention is not limited to the specific embodiments, and should be construed as including all changes, equivalents, and substitutions included in the spirit and scope of the present invention.

Terms used in the present disclosure are mostly normal terms that are presently widely used, but in some cases, a term that is arbitrarily selected by an applicant exists, and in this case, a meaning thereof should be understood by being disclosed in the description of the present invention, or by considering the used meaning.

Parts that are not associated with the description are omitted to specifically describe the present invention, and like reference numerals refer to like elements throughout the specification. Further, in the drawings, size and thickness of each element may be arbitrarily illustrated for convenience of description, and the present invention is not necessarily limited to those illustrated in the drawings. Also, the thicknesses of layers and regions may be enlarged for clarity, and/or may be exaggerated for convenience of description. It will be understood that when an element such as a layer, film, region, or substrate is referred to as being "on" another element, it can be directly on the other element or one or more intervening elements may be present.

Figure 2:
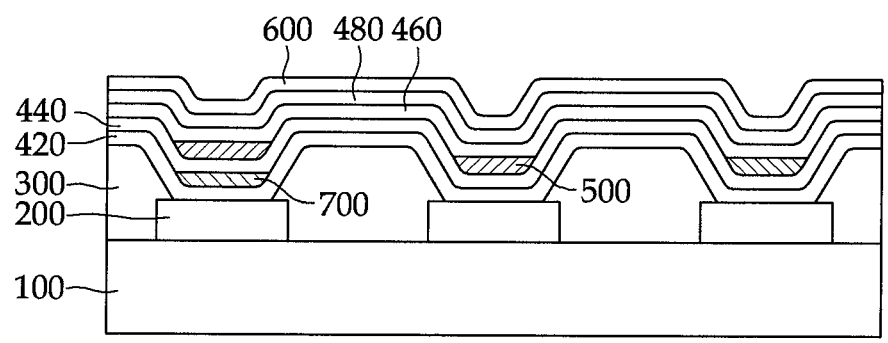
FIG. 2 is a cross-sectional view of an organic light emitting diode display according to an exemplary embodiment of the present invention.

FIG. 2 is a cross-sectional view schematically illustrating an organic light emitting diode display according to an exemplary embodiment of the present invention. As illustrated in FIG. 2, an organic light emitting diode display according to an exemplary embodiment of the present invention includes a substrate 100; a first electrode 200 formed on the substrate 100; a light-emitting layer 500 formed on the first electrode 200; and a second electrode 600 formed on the light-emitting layer 500, and further includes a p-doping layer 700 between the first electrode 200 and the light-emitting layer 500.

First, the substrate 100 may be made of, for example, a transparent glass material containing $SiO_2$ as a main constituent, although the substrate 100 is not necessarily limited thereto, and may be made of a plastic material and may also be mae of metal foil and the like. Although not illustrated in the drawing, the substrate 100 may include at least one thin film transistor or capacitor for driving each pixel, and a circuit for pixel-driving may be implemented by using the thin film transistor, the capacitor, and the like.

A pixel defining layer 300 is formed on the substrate 100, and includes a plurality of openings, which may have a matrix shape, for exposing a first electrode 200 and for defining each pixel. That is, each pixel is partitioned by the pixel defining layer 300.

The first electrode 200 may include a plurality of pixels which may emit lights having different colors. In the present exemplary embodiment, the first electrode 200 may include a region where red light is emitted, another region where green light is emitted, and yet another region where blue light is emitted.

Each pixel includes the first electrode 200, a light-emitting layer 500, and a second electrode 600. The first electrode 200 is formed on the substrate and partitioned by the pixel defining layer 300 for each pixel. Any one of a red pixel, a green pixel, and a blue pixel, to be described below, may be respectively located in an opening formed by the pixel defining layer 300.

The first electrode 200 is positioned on the substrate 100, and may be formed of a reflective conductive material, a transparent conductive material, a translucent conductive material, and the like.

In the case of a bottom-emission type in which an image is produced in a direction of the substrate 100, the first electrode 200 may be a transparent electrode, and the second electrode 600 may be a reflective electrode. In this case, the first electrode may be made of a material having high work function, for example, ITO, IZO, ZnO, In2O3, or the like, and the second electrode may be made of a metal having low work function, such as, for example, Ag, Mg, Al, Pt, Au, Ni, Nd, Ir, Cr, Li, Ca, or the like.

In a top-emission type, in which an image is produced in a direction of the second electrode 600, the first electrode 200 may be provided as a reflective electrode, and the second electrode 600 may be provided as a transparent electrode. In this case, the reflective electrode as the first electrode 200 may be provided by forming a reflective layer with, for example, Ag, Mg, Al, Pt, Au, Ni, Nd, Ir, Cr, Li, Ca, and their compounds, and by then forming thereon a material having high work function, for example, ITO, IZO, ZnO, In2O3, or the like. In addition, the transparent electrode as the second electrode 600 may be provided by depositing metals having low work function such as, for example, Ag, Mg, Al, Pt, Au, Ni, Nd, Ir, Cr, Li, Ca, and their compounds, and by then forming thereon an auxiliary electrode layer or a bus electrode line with a transparent conductive material such as, for example, ITO, IZO, ZnO, In2O3, or the like.

In the case of a dual-emission type, both the first electrode 200 and the second electrode 600 may be formed as transparent electrodes.

Hereinafter, in the exemplary embodiment, a structure of the top-emission type organic light emitting diode display will be described. Accordingly, the second electrode 600 according to the exemplary embodiment may be made of a light-transmissive material.

As illustrated in FIG. 2, the first electrode 200 may be partitioned by the pixel defining layer 300 for each pixel unit.

A hole injection layer 420 may be formed on the first electrode 200, and may be formed by using a material that is generally used in the hole injection layer, for example, CuPc (copper phthalocyanine) or IDE 406 (Idemitsu Kosan Co., Ltd.), through a general method such as vacuum deposition or spin coating.

Next, a hole transport layer 440 may be formed on the hole injection layer 420. The hole transport layer 440 may be formed through a general method such as vacuum deposition or spin coating, and may be formed by using a general material for hole transport, for example, a kind or more of N,N'-di(1-naphthyl)-N,N'-diphenylbenzidine (NPD), bis(4-dimethylamino-2-methylphenyl)phenylmethane, 1,1-bis(4-di-p-tolylaminophenyl)cyclohexane, 1,1-bis(4-di-p-tolylaminophenyl)-4-phenyl-cyclohexane, and the like.

Next, the light-emitting layer 500 is formed on the hole transport layer 440 through a general method such as, for example, vacuum deposition or spin coating. A material of the light-emitting layer 500 is not particularly limited, and the light-emitting layer 500 may be formed by doping a general dopant, for example, iridiumtris(phenylpyridine) (Irppy$^3$) on a general host, for example, carbazolbiphenyl (CBP), and by depositing the dopant and the host together.

According to the exemplary embodiment, the light-emitting layer 500 includes a red light-emitting layer, a green light-emitting layer, and a blue light-emitting layer. In the red light-emitting layer, the green light-emitting layer, and the blue light-emitting layer, holes supplied through the red pixel, the green pixel, and the blue pixel and electrons supplied through the second electrode 600 are coupled with each other to form excitons, and when an energy level of the excitons is changed from an excited state to a ground state, light having a color corresponding to the changed energy level is emitted.

As illustrated in FIG. 2, at least one of an electron transfer layer 460 and an electron injection layer 480 may be formed between the light-emitting layer 500 and the second electrode 600.

The electron transfer layer 460 may be formed by using, for example, a vacuum deposition method or a spin coating method, and a material for the electron transfer layer is not particularly limited, but may include an aluminum complex (for example, tris(8-quinolinolato)-aluminum (Alq3)).

The electron injection layer 480 may be selectively formed on the electron transfer layer 460 by using a method such as vacuum deposition or spin coating. In the present embodiment, a material for the electron injection layer 480 is not particularly limited, but may include a material such as LiF, NaCl, and CsF.

Next, the second electrode 600 is formed on the electron injection layer 480, and a potential difference (e.g., voltage) may be formed between the second electrode 600 and the first electrode 200 by a potential applied to the second electrode 600. In detail, the second electrode 600 is formed as a common layer on the red light-emitting layer, the green light-emitting layer, and the blue light-emitting layer.

In an exemplary embodiment of the present invention, the second electrode 600 may be formed of a light-transmissive material. In the present exemplary embodiment, the second electrode 600 may be formed of a reflective conductive material, a transparent conductive material, and a translucent conductive material like the first electrode 200 described above.

In the organic light emitting diode display according to the present embodiment, a p-doping layer 700 is provided between the first electrode 200 and the light-emitting layer 500, and a thickness of the p-doping layer 700 may be, for example, in the range of about 10 Å to about 200 Å.

A position of the p-doping layer 700 is not limited to between the first electrode 200 and the light-emitting layer 500, and the p-doping layer 700 may be disposed below the hole injection layer 420, between the hole injection layer 420 and the hole transport layer 440, or on the hole transport layer 440.

In the present exemplary embodiment of the present invention, the p-doping layer 700 is formed between the hole injection layer 420 and the hole transport layer 440.

The p-doping layer 700 contains a p-doping material. An example of the p-doping layer 700 includes a layer made of the p-doping material.

In another example of the p-doping layer 700, the p-doping material may be doped on a resonance auxiliary layer. For example, the resonance auxiliary layer is formed as a matrix, and the p-doping layer 700 may have a configuration in which the p-doping material is doped in the matrix. Here, the resonance auxiliary layer is a layer added for improving light extraction efficiency. The resonance auxiliary layer as the matrix may use an auxiliary layer material which is generally used in the art.

The p-doping material may use a material that is generally used in the art, and may use a material in which hole mobility is larger than electron mobility. For example, the p-doping material may be selected from hexanitril hexaazatriphenylene, trifluoro-tetracyanoquinodimethane (F4-TCNQ), lithium quinolate (LiQ) $FeCl_3$, $F_{16}CuPc$, vanadium oxide ($V_2O_5$), rhenium oxide ($Re_2O_7$), indium tin oxide, and a compound represented by the following Chemical Formula 1.

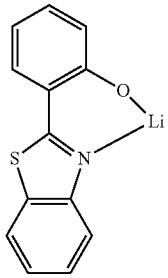

[Chemical Formula 1]

The p-doping material for the matrix is doped preferably in the range of about 0.1 wt % to about 30 wt %, and more preferably about 0.1 wt % to about 10 wt %. When the p-doping material is less than about 0.1 wt %, an effect according to an addition of the p-doping material may be slight, and when the p-doping material is more than about 30 wt %, an interface characteristic with an electrode is not good, and thus defects may occur, and as a result, current may leak when an inverse voltage is applied.

Further, the resonance auxiliary layer as the matrix may be formed of a material having excellent hole injection characteristics, for example, an indolo fluorine-based arylamine compound, LG101(TM), or the like.

The p-doping layer 700 is present in at least one of the red pixel, the green pixel, and the blue pixel to control relative efficiency and relative driving voltage.

For example, in a case where the green pixel has the highest efficiency and the lowest driving voltage, as illustrated in FIG. 2, the p-doping layer 700 may be formed in the red pixel, such that the driving voltage of the red pixel becomes lower than that of the green pixel, and as a result, current that would otherwise flow in the green pixel may be diverted to the red pixel to lower black luminance.

Figure 3:
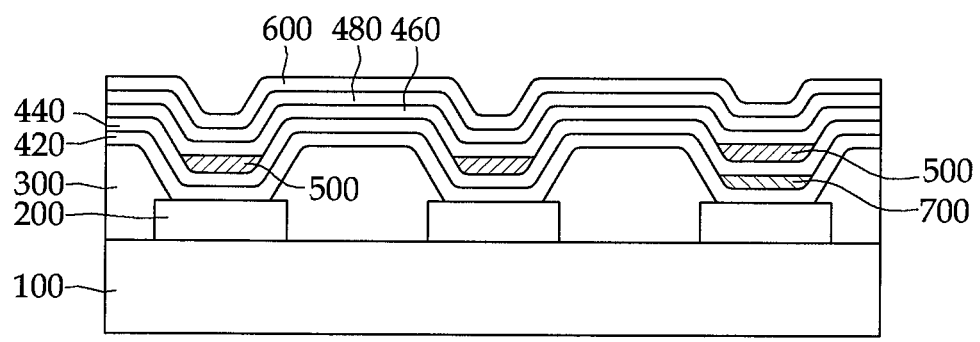
FIG. 3 is a cross-sectional view of an organic light emitting diode display according to another exemplary embodiment of the present invention.
Figure 4:
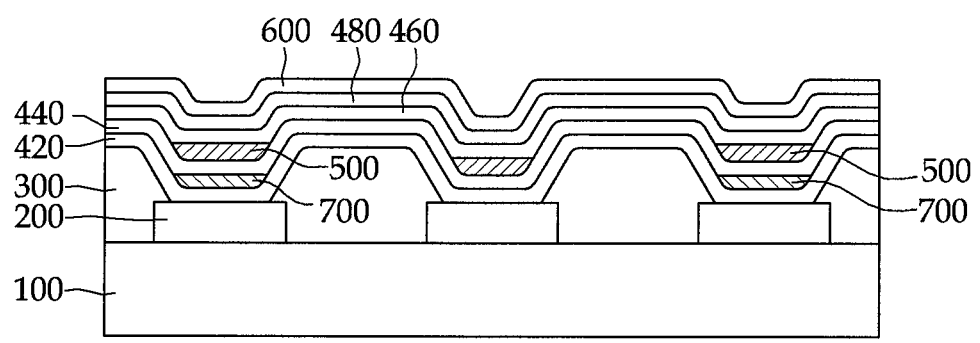
FIG. 4 is a cross-sectional view of an organic light emitting diode display according to yet another exemplary embodiment of the present invention.

As another example, in FIG. 3, the p-doping layer 700 is formed in the blue pixel to control driving voltage, and in FIG. 4, the p-doping layer 700 is formed in the red pixel and the blue pixel to control relative driving voltage.

Although not illustrated in FIGS. 2 to 4, a glass cap facing the substrate 100 may be disposed using vacuum on the second electrode 600, and may include a sealing member for shielding the light-emitting layer 500 formed between the substrate 100 and the second electrode 600 from external air. The sealing member may include one or more materials selected from a group consisting of an acrylic resin, a methacrylic resin, polyisoprene, a vinyl resin, an epoxy resin, a urethane resin, and a cellulose resin.

Accordingly, the organic light emitting diode display according to the present embodiment has the laminated structure, as illustrated in FIGS. 2 to 4, and may further include one or two intermediate layers, for example, a hole blocking layer and the like if necessary or desired. Further, a thickness of each layer of the organic light emitting diode display may be in a generally used range in the art, if necessary or desired.

In an organic light emitting diode display having a general structure in the related art, when the light emission efficiency of green is the highest and the driving voltage becomes the lowest by introducing a high-efficiency green light emitting material, the green pixel emits light in a black state, and as a result, black luminance is increased, and a contrast ratio is deteriorated.

However, like the organic light emitting diode display according to the present exemplary embodiment of the present invention, when the p-doping layer is formed in the red pixel, or when a material having excellent hole injection is applied to the red pixel, since the driving voltage of the red pixel having relatively low efficiency is lowered by about 1 eV, leakage current concentrated in the green pixel is dispersed to the red pixel to prevent the green pixel from emitting light in a black state (or to reduce the effects of), and as a result, the black luminance may be lowered, and the contrast ratio may be improved.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims and their equivalents.

What is claimed is:

1. An organic light emitting diode display comprising:
   a substrate;
   a first electrode on the substrate;
   a light-emitting layer on the first electrode, the light-emitting layer comprising a red light-emitting layer, a green light-emitting layer, and a blue light-emitting layer;
   a second electrode on the light-emitting layer; and
   a p-doping layer between the first electrode and the light-emitting layer,
   wherein the p-doping layer is in only some of a red pixel corresponding to the red light-emitting layer, a blue pixel corresponding to the blue light-emitting layer, and a green pixel corresponding to the green light-emitting layer.

2. The organic light emitting diode display of claim 1, wherein the p-doping layer is in at least one of a red pixel corresponding to the red light-emitting layer or a blue pixel corresponding to the blue light-emitting layer.

3. The organic light emitting diode display of claim 1, wherein the p-doping layer is in only the red pixel corresponding to the red light-emitting layer.

4. The organic light emitting diode display of claim 1, further comprising at least one of a hole injection layer (HIL) and a hole transport layer (HTL) between the first electrode and the light-emitting layer.

5. The organic light emitting diode display of claim 1, wherein the p-doping layer comprises at least one of hexanitril hexaazatriphenylene, trifluoro-tetracyanoquinodimethane (F4-TCNQ), lithium quinolate (LiQ) FeCl3, F16CuPc, a compound represented by the following Chemical Formula 1, or a metal oxide

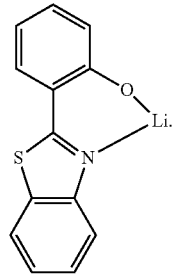

[Chemical Formula 1]

6. The organic light emitting diode display of claim 5, wherein the metal oxide comprises vanadium oxide (V2O5), rhenium oxide (Re2O7), or indium tin oxide.

7. The organic light emitting diode display of claim 1, wherein a thickness of the p-doping layer is about 10 Å to about 200 Å.

8. The organic light emitting diode display of claim 1, wherein the p-doping layer comprises a resonance auxiliary layer.

9. The organic light emitting diode display of claim 8, wherein the resonance auxiliary layer is in a matrix, and
wherein a p-doping material is in the matrix.

10. The organic light emitting diode display of claim 9, wherein the p-doping material is about 0.1 wt % to about 30 wt % of the matrix.

11. An organic light emitting diode display comprising:
a substrate;
a first electrode on the substrate;
a light-emitting layer on the first electrode;
a second electrode on the light-emitting layer;
a hole injection layer (HIL) and a hole transport layer (HTL) between the first electrode and the light-emitting layer; and
a p-doping layer between the first electrode and the light-emitting layer,
wherein the hole injection layer (HIL) and the hole transport layer (HTL) are between the first electrode and the light-emitting layer, and
wherein the p-doping layer is between the hole injection layer (HIL) and the hole transport layer (HTL).

12. A manufacturing method of an organic light emitting diode display, the method comprising:
forming a first electrode on a substrate;
forming a red light-emitting layer, a green light-emitting layer, and a blue light-emitting layer on the first electrode;
forming a second electrode on each of the light-emitting layers; and
forming a p-doping layer between the first electrode and respective light-emitting layers in only some of a red pixel corresponding to the red light-emitting layer, a blue pixel corresponding to the blue light-emitting layer, and a green pixel corresponding to the green light-emitting layer.

13. The manufacturing method of an organic light emitting diode display of claim 12,
wherein the p-doping layer is in at least one of a red pixel corresponding to the red light-emitting layer and a blue pixel corresponding to the blue light-emitting layer.

14. The manufacturing method of an organic light emitting diode display of claim 12,
wherein the p-doping layer is in all only the red pixel corresponding to the red light-emitting layer.

* * * * *